United States Patent
Matsui

(10) Patent No.: US 8,446,067 B2
(45) Date of Patent: May 21, 2013

(54) ULTRASONIC MOTOR

(75) Inventor: Akira Matsui, Hino (JP)

(73) Assignee: Olympus Corporation, Tokyo (JP)

( * ) Notice: Subject to any disclaimer, the term of this patent is extended or adjusted under 35 U.S.C. 154(b) by 330 days.

(21) Appl. No.: 13/014,003

(22) Filed: Jan. 26, 2011

(65) Prior Publication Data

US 2011/0187228 A1   Aug. 4, 2011

(30) Foreign Application Priority Data

Jan. 29, 2010   (JP) ................................. 2010-019565

(51) Int. Cl.
*H02N 2/00*   (2006.01)
*H01L 41/09*   (2006.01)

(52) U.S. Cl.
USPC .................. 310/317; 310/316.01; 310/323.16

(58) Field of Classification Search
USPC ................................ 310/316.01, 317, 323.16
See application file for complete search history.

(56) References Cited

U.S. PATENT DOCUMENTS

| | | | |
|---|---|---|---|
| 5,723,935 A * | 3/1998 | Tomikawa et al. ....... | 310/323.02 |
| 2011/0187229 A1 * | 8/2011 | Matsui et al. ............ | 310/323.16 |
| 2011/0187231 A1 * | 8/2011 | Takizawa et al. ........ | 310/323.16 |
| 2011/0204748 A1 * | 8/2011 | Matsui ..................... | 310/323.16 |
| 2011/0234049 A1 * | 9/2011 | Takizawa ................. | 310/323.12 |
| 2012/0019103 A1 * | 1/2012 | Matsui ..................... | 310/323.02 |
| 2012/0038246 A1 * | 2/2012 | Sakamoto ................ | 310/323.16 |

FOREIGN PATENT DOCUMENTS

JP   A 9-85172   3/1997

* cited by examiner

*Primary Examiner* — Thomas Dougherty
(74) *Attorney, Agent, or Firm* — Scully, Scott, Murphy & Presser, P.C.

(57) ABSTRACT

An ultrasonic motor is configured as follows. Namely, the ultrasonic motor includes an oscillator which is configured to has a shape that conforms a resonant frequency of longitudinal oscillation exited in the oscillator to a resonant frequency of torsional oscillation, a driven body that comes into contact with an elliptic oscillation generation surface of the oscillator and is driven by the elliptic oscillation, and a pressing mechanism unit that welds the elliptic oscillation generation surface of the oscillator to the driven body by pressing, wherein the oscillator has a first polarization unit that is formed in a region associated with a node portion of the longitudinal oscillation and configured to excite the longitudinal oscillation in the oscillator, and a second polarization unit that is formed in a region associated with a ventral portion of the torsional oscillation and configured to excite the torsional oscillation in the oscillator.

5 Claims, 10 Drawing Sheets

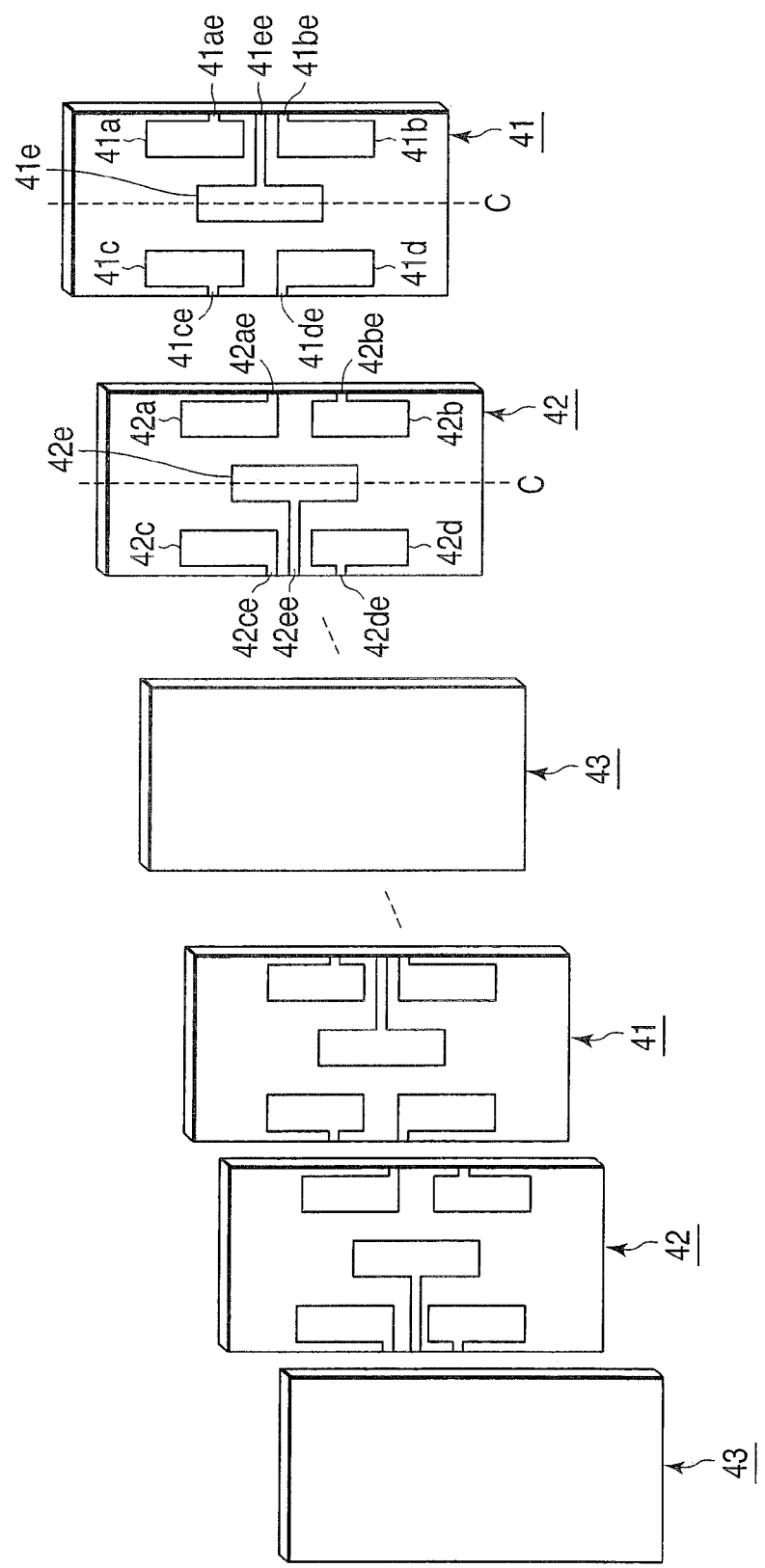
F I G. 2

Ventral portions in torsional secondary oscillation mode

Ventral portions in torsional tertiary oscillation mode

ULTRASONIC MOTOR

CROSS-REFERENCE TO RELATED APPLICATIONS

This application is based upon and claims the benefit of priority from prior Japanese Patent Application No. 2010-019565, filed Jan. 29, 2010, the entire contents of which are incorporated herein by reference.

BACKGROUND OF THE INVENTION

1. Field of the Invention

The present invention relates to an ultrasonic motor that utilizes oscillation of an oscillator of, e.g., a piezoelectric element, and more particularly to an ultrasonic motor that utilizes elliptic oscillation produced when longitudinal oscillation and torsional oscillation are simultaneously excited.

2. Description of the Related Art

In recent years, as a new motor that substitutes for an electromagnetic motor, an ultrasonic motor that utilizes oscillation of an oscillator of, e.g., a piezoelectric element attracts attention. As compared with a conventional electromagnetic motor, this ultrasonic motor has advantages in that, e.g., low-speed and high thrust can be obtained without a gear, retaining force is high, resolution is high, quietness is high, and magnetic noise can be prevented from being generated.

Specifically, for example, when an oscillator formed of an ultrasonic oscillator is pressed against a rotor that is a driven member trough a frictional member fixed on the oscillator, frictional force is generated between the frictional member and the rotor, and the rotor is driven by using this frictional force.

In more detail, when longitudinal oscillation and torsional oscillation are simultaneously generated in the ultrasonic oscillator, elliptic oscillation as a combination of these oscillations is produced at an end face of the ultrasonic oscillator, and the rotor is rotated by utilizing this elliptic oscillation. As a technology concerning such an ultrasonic motor, for example, JP-A 9-85172 (KOKAI) discloses the following technology.

That is, JP-A 9-85172 (KOKAI) discloses an ultrasonic motor comprising: a rod-like elastic body; a plurality of holding elastic bodies provided on a side surface of the rod-like elastic body to be integral with the rod-like elastic body; a plurality of pairs of laminated piezoelectric elements arranged in such a manner that each piezoelectric element is held at both ends by each of the plurality of holding elastic bodies and forms an acute angle between a displacement direction thereof and a longitudinal direction of the rod-like elastic body and that the plurality of pairs of these piezoelectric elements are inclined in opposite directions; a plurality of oscillation detecting piezoelectric elements provided between the laminated piezoelectric elements and the holding elastic bodies; a friction block provided on an end face of the rod-like elastic body; a rotor arranged being appressed against the friction block by pressing means; and power supplying means for applying alternating voltages having predetermined frequencies and intensities associated with phases or amplitudes of signals output from the oscillation detection piezoelectric elements and having phase differences to the respective pairs of laminated piezoelectric elements. In this ultrasonic motor, longitudinal oscillation and torsional oscillation are simultaneously excited in the rod-like elastic body, whereby ultrasonic elliptic oscillation is excited on the friction block, thus driving the rotor to rotate.

Specifically, according to the technology disclosed in JP-A 9-85172 (KOKAI), one or more pairs of laminated piezoelectric elements are held between the holding elastic bodies each having a concave portion into which the laminated piezoelectric element can be inserted and the rod-like elastic body. Further, the holding elastic bodies are arranged to abut on the laminated piezoelectric elements, compression stress is applied, and the laminated piezoelectric elements are fixed to the rod-like elastic body through screws in this state.

Therefore, when adopting the configuration disclosed in JP-A 9-85172 (KOKAI), each holding elastic body used for fixing the piezoelectric element is an essential constituent element, and concave portions in which the holding elastic body and the piezoelectric element are arranged must be formed in the rod-like elastic body. As described above, the ultrasonic motor disclosed in JP-A 9-85172 (KOKAI) is not an ultrasonic motor having high assembling easiness.

BRIEF SUMMARY OF THE INVENTION

The present invention has been made in consideration of the above situation, and has as its object to provide an ultrasonic motor having the simple configuration and the high assembling easiness.

According to an aspect of the present invention, there is provided an ultrasonic motor comprising:

an oscillator whose cross section vertical to a central axis has a rectangular shape and which generates elliptic oscillation when longitudinal oscillation that expands or contracts in the central axis direction and torsional oscillation using the central axis as a torsional axis are simultaneously excited, a length ratio of a narrow side and a wide side constituting the rectangular shape being set to a value that conforms a resonant frequency of the longitudinal oscillation exited in the oscillator to a resonant frequency of the torsional oscillation;

a driven body that comes into contact with an elliptic oscillation generation surface of the oscillator in which an elliptic oscillation is generated and is driven to rotate by the elliptic oscillation around the central axis; and a pressing mechanism unit that presses the oscillator against the driven body and welds the elliptic oscillation generation surface of the oscillator to the driven body by pressing, wherein the oscillator has:

a first polarization unit that is formed in a region associated with a node portion of the longitudinal oscillation and configured to excite the longitudinal oscillation in the oscillator; and a second polarization unit that is formed in a region associated with a ventral portion of the torsional oscillation and configured to excite the torsional oscillation in the oscillator.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a view showing a structural example of piezoelectric sheets constituting an oscillator;

DETAILED DESCRIPTION OF THE INVENTION

Embodiments according to the present invention will now be described hereinafter with reference to the accompanying drawings.

First Embodiment

Figure 1:
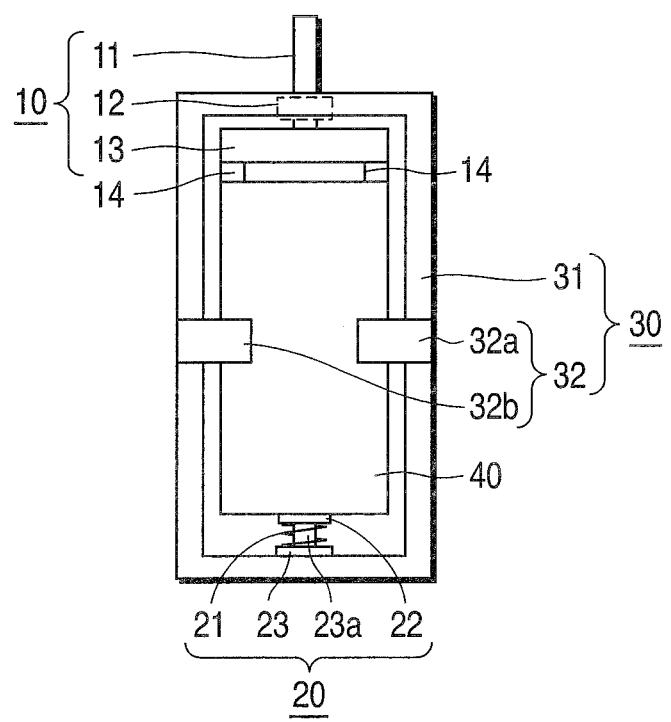
FIG. 1 is a front view showing a structural example of an ultrasonic motor according to a first embodiment of the present invention.

FIG. 1 is a front view showing a structural example of an ultrasonic motor according to a first embodiment of the present invention. As shown in FIG. 1, the ultrasonic motor according to this first embodiment includes a rotor mechanism unit 10, a pressing mechanism unit 20, a housing unit 30, and an oscillator 40.

The rotor mechanism unit 10 has a rotary shaft (a central shaft) 11, a bearing 12, and a rotor 13.

The rotary shaft 11 is a shaft member coupled with a central portion of the rotor 13. It is to be noted that each constituent member in the rotor mechanism unit 10 is concentrically arranged with respect to this rotary shaft 11.

The bearing 12 is a bearing member that is fixed to a frame 31 included in the later-described housing unit 30 and has the rotary shaft 11 inserted therein.

The rotor 13 is arranged to come into contact with a frictional member 14 provided on an upper surface of the oscillator 40. This rotor 13 is caused to slide by the frictional member 14 with elliptic oscillation excited on the upper surface of the oscillator 40 being used as a driving source, and it thereby rotates around the rotary shaft 11.

The pressing mechanism unit 20 has a pressing spring 21, a pressing member 22, and a fixed plate 23 having a spring regulation member 23a provided thereto.

The pressing spring 21 is a spring member configured to press the later-described oscillator 40 against the rotor 13. Specifically, this pressing spring 21 is, e.g., a leaf spring or a coil spring.

The pressing member 22 is provided at a substantially central portion of a bottom surface (a surface facing the pressing mechanism unit 20) of the oscillator 40, and the pressing force of the pressing spring 21 is transmitted to the oscillator 40 via the pressing member 22.

The fixed plate 23 is fixed to the later-described frame 31 and has the spring regulation member 23a provided thereto as a protruding portion that positions the pressing spring 21. This spring regulation member 23a is inserted in the pressing spring 21 to position the pressing spring 21.

The housing unit 30 has the frame 31 and a support member 32.

The frame 31 is a frame member having a substantially rectangular parallelepiped outer shape and holds the oscillator 40 together with the pressing mechanism unit 20 and the support member 32.

The support member 32 is constituted of a support member 32a and a support member 32b that are provided to the frame 31 while facing each other to sandwich the oscillator 40 therebetween. This support member 32 is provided at, e.g., a position corresponding to a node portion of torsional oscillation excited in the oscillator 40.

The oscillator 40 adopts a later-described configuration, and the frictional member 14 that is in contact with the rotor 13 is provided on an upper end surface (a surface facing the rotor mechanism unit 10) thereof.

FIG. 2 is a view showing a structural example of piezoelectric sheets constituting the oscillator 40. The oscillator 40 is constructed by alternately laminating a first piezoelectric sheet 41 and a second piezoelectric sheet 42 in a thickness direction thereof, and a third piezoelectric sheet 43 is arranged in the uppermost region and an intermediate region of this laminated body obtained by lamination.

The first piezoelectric sheet 41, the second piezoelectric sheet 42, and the third piezoelectric sheet 43 are rectangular sheet-like piezoelectric elements. As the first piezoelectric sheet 41, the second piezoelectric sheet 42, and the third piezoelectric sheet 43, for example, piezoelectric ceramics elements consisting of a hard type lead zirconate titanate (PZT) is used.

Although particulars will be described later, internal electrodes each having an activated region obtained by polarization in the thickness direction are provided in each of the first piezoelectric sheet 41 and the second piezoelectric sheet 42. As this internal electrode, for example, a silver-palladium alloy having a thickness of 4 μm can be used.

An internal electrode 41a and an internal electrode 41c are provided on an electrode forming surface of the first piezoelectric sheet 41 to be symmetrical with respect to a central line C (a line that bisects a narrow side), and an internal electrode 41b and an internal electrode 41d are likewise provided to be symmetrical with respect to the central line C. Furthermore, an internal electrode 41e is provided at a substantially central portion of the electrode forming surface of the first piezoelectric sheet 41. In more detail, the internal electrodes 41a, 41b, 41c, 41d, and 41e are provided at the following positions on the electrode forming surface of the first piezoelectric sheet 41.

Figure 3:
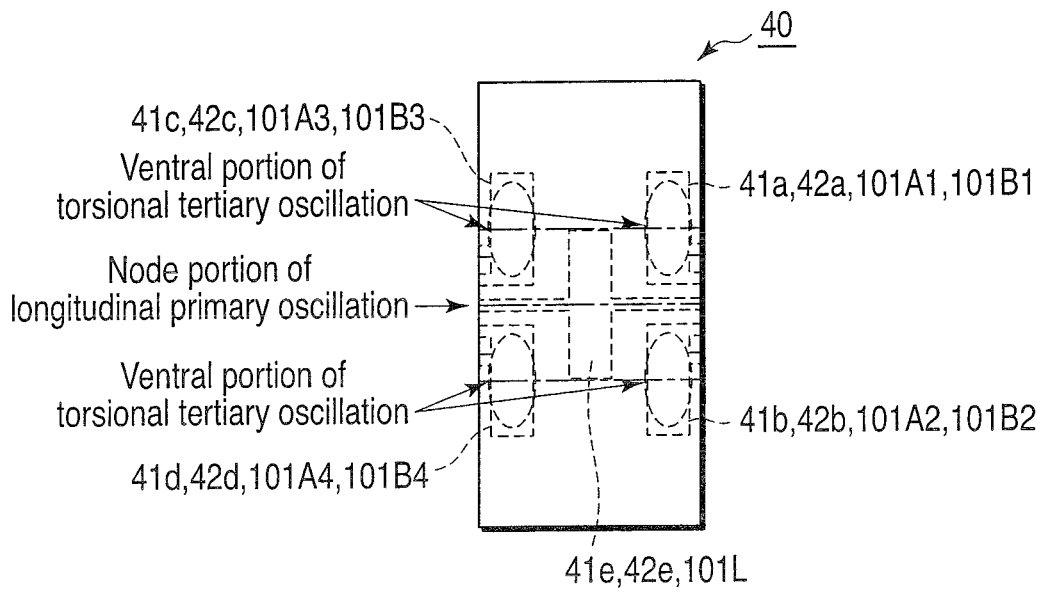
FIG. 3 is a view showing a node portion of longitudinal primary oscillation and ventral portions of torsional tertiary oscillation in the oscillator and polarization units constituted of respective internal electrodes provided in each piezoelectric sheet.

FIG. 3 is a view showing a position of a node portion of longitudinal oscillation and positions of ventral portions of torsional tertiary oscillation and positions of polarization units constituted of the respective internal electrodes provided in each piezoelectric sheet.

As shown in FIG. 3, the internal electrodes 41a, 41b, 41c, and 41d are provided at positions corresponding to the ventral portions of the torsional tertiary oscillation excited in the oscillator 40. The internal electrode 41e is provided at a position corresponding to the node portion of the longitudinal primary oscillation excited in the oscillator 40.

Moreover, in the oscillator 40, regions where the internal electrode 41a and an internal electrode 42a are laminated constitute later-described polarization units 101A1 and 101B1. Regions where the internal electrode 41b and an internal electrode 42b are laminated constitute later-described polarization units 101A2 and 101B2. Regions where the internal electrode 41c and an internal electrode 42c are laminated constitute later-described polarization units 101A3 and 101B3. Regions where the internal electrode 41d and an internal electrode 42d are laminated constitute later-described polarization units 101A4 and 101B4. A region where the internal electrode 41e and an internal electrode 42e are laminated constitutes a later-described polarization unit 101L.

An exposed portion 41ae extended toward an edge of one wide side of the first piezoelectric sheet 41 is provided to the internal electrode 41a as shown in FIG. 2. Likewise, an exposed portion 41be extended toward the edge of the one wide side of the first piezoelectric sheet 41 is provided to the internal electrode 41b. Likewise, an exposed portion 41ee extended toward the edge of the one wide side of the first piezoelectric sheet 41 is provided to the internal electrode 41e.

An exposed portion 41ce extended toward an edge of the other wide side of the first piezoelectric sheet 41 is provided to the internal electrode 41c. Likewise, an exposed portion 41de extended toward the edge of the other wide side of the first piezoelectric sheet 41 is provided to the internal electrode 41d.

Additionally, the internal electrodes 42a, 42b, 42c, 42d, and 42e are provided on an electrode forming surface of the second piezoelectric sheet 42 at positions corresponding to the internal electrodes 41a, 41b, 41c, 41d, and 41e when laminated, respectively.

To these internal electrodes 42a, 42b, 42c, and 42d are provided exposed portions 42ae, 42be, 42ce, and 42de that are extended to a side associated with (overlapping at the time of lamination) the side to which the exposed portions 41ae, 41be, 41ce, and 41de of the respective internal electrodes 41a, 41b, 41c, and 41d are extended. However, an exposed portion 42ee of the internal electrode 42e is provided being extended to a wide side facing the wide side to which the exposed portion 41ee of the internal electrode 41e is extended.

Here, the exposed portion 41ae and the exposed portion 42ae are provided to deviate from each other at a predetermined interval so that they do not overlap each other when laminated. The exposed portion 41be and the exposed portion 42be are provided to deviate from each other at a predetermined interval so that they do not overlap each other when laminated. The exposed portion 41ce and the exposed portion 42ce are provided to deviate from each other at a predetermined interval so that they do not overlap each other when laminated. The exposed portion 41de and the exposed portion 42de are provided to deviate from each other at a predetermined interval so that they do not overlap each other when laminated. On the other hand, the exposed portion 41ee and the exposed portion 42ee do not overlap each other when laminated since the sides to which these exposed portions are extended are not associated with each other.

Internal electrodes are not provided in the third piezoelectric sheet 43.

Figure 4:
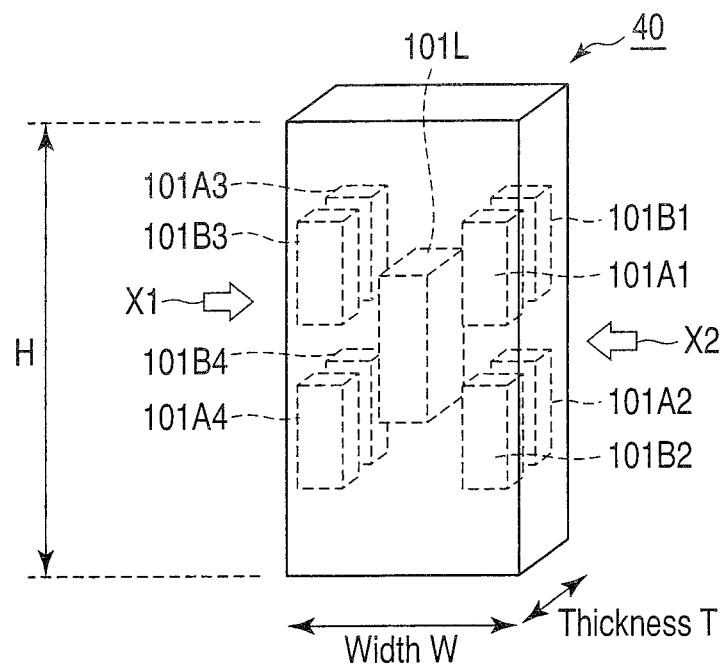
FIG. 4 is a view showing a structural example of the oscillator.

As explained above, overlapping the first piezoelectric sheet 41, the second piezoelectric sheet 42, and the third piezoelectric sheet 43 enables obtaining the oscillator 40 depicted in FIG. 4. It is to be noted that, in FIG. 4, the electrodes present in the oscillator 40 are visualized and illustrated and the respective piezoelectric sheets are not individually illustrated but integrally shown as the oscillator 40 for convenience of explanation.

Here, the polarization unit 101A1 and the polarization unit 101B1 are constituted to be symmetrical with respect to the third piezoelectric sheet arranged in an intermediate region in a laminating direction of the piezoelectric sheets. The polarization unit 101A2 and the polarization unit 101B2 are constituted to be symmetrical with respect to the third piezoelectric sheet arranged in the intermediate region in the laminating direction of the piezoelectric sheets. The polarization unit 101A3 and the polarization unit 101B3 are constituted to be symmetrical with respect to the third piezoelectric sheet arranged in the intermediate region in the laminating direction of the piezoelectric sheets. The polarization unit 101A4 and the polarization unit 101B4 are constituted to be symmetrical with respect to the third piezoelectric sheet arranged in the intermediate region in the laminating direction of the piezoelectric sheets.

The polarization units 101A1, 101B1, 101A2, 101B2, 101A3, 101B3, 101A4, and 101B4 are polarization units configured to excite the torsional tertiary oscillation in the oscillator 40, and they are placed at positions corresponding to ventral portions of the torsional tertiary oscillation excited in the oscillator 40.

The polarization unit 101L is a polarization unit configured to excite the longitudinal primary oscillation in the oscillator 40, and it is placed at a position corresponding to a node portion of the longitudinal primary oscillation excited in the oscillator 40.

Figure 5:
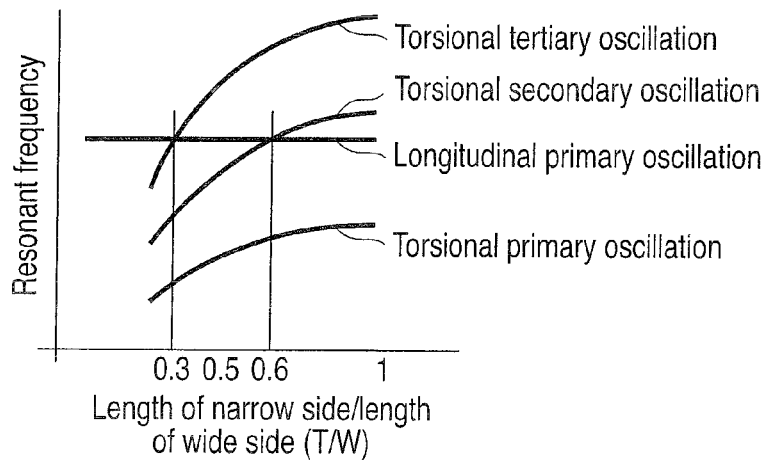
FIG. 5 is a view showing resonant frequency characteristics of longitudinal oscillation and torsional oscillation.
Figure 6:
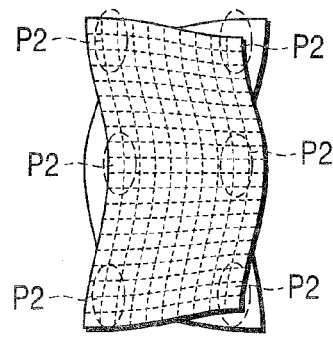
FIG. 6 is a view showing positions of ventral portions in a torsional secondary oscillation mode.
Figure 7:
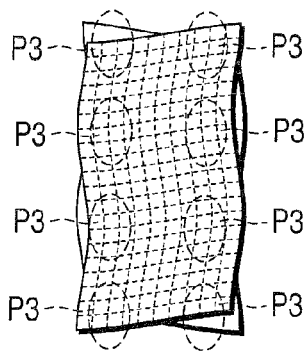
FIG. 7 is a view showing positions of ventral portions in a torsional tertiary oscillation mode.

The longitudinal oscillation and the torsional oscillation will now be described hereinafter in detail with reference to FIG. 5 to FIG. 7. FIG. 5 is a view showing resonant frequency characteristics of the longitudinal oscillation and the torsional oscillation. FIG. 6 is a view showing positions of the ventral portions in a torsional secondary oscillation mode. FIG. 7 is a view showing positions of the ventral portions in a torsional tertiary oscillation mode.

Here, as shown in FIG. 4, it is assumed that H is a height, T is a thickness (a narrow side), and W is a width (a long side) of the oscillator 40. Further, when the height H is fixed, an abscissa represents a value (the thickness T/the width W), and an ordinate represents a value of a resonant frequency in each oscillation mode, characteristics shown in FIG. 5 can be obtained. Specifically, the following characteristics can be obtained.

A value of a resonant frequency in a longitudinal primary oscillation mode takes a substantially fixed value without being dependent on a value of (T/W).

Values of resonant frequencies in the torsional primary oscillation mode, the torsional secondary oscillation mode, and the torsional tertiary oscillation mode increase with an increase in value of (T/W).

A resonant frequency in the torsional primary longitudinal mode does not coincide with a resonant frequency in the longitudinal primary oscillation mode irrespective of a value of (T/W).

A resonant frequency in the torsional secondary oscillation mode coincides with a resonant frequency in the longitudinal primary longitudinal mode in the vicinity of 0.6 as a value of (T/W).

A resonant frequency in the torsional tertiary oscillation mode coincides with a resonant frequency in the longitudinal primary oscillation mode in the vicinity of 0.3 as a value of (T/W).

Since the above-described characteristics are provided, the following settings are configured.

When utilizing the longitudinal primary oscillation mode and the torsional tertiary oscillation mode, the thickness T and the width W of the oscillator 40 are set so that a value of (T/W) can fall within the range of 0.25 to 0.35.

When utilizing the longitudinal primary oscillation mode and the torsional secondary oscillation mode, the thickness T and the width W of the oscillator 40 are set so that a value of (T/W) can fall within the range of 0.55 to 0.65.

It is to be noted that the oscillator 40 in the torsional secondary oscillation mode torsionally oscillates as shown in FIG. 6. That is, in this drawing, each region denoted by reference character P2 serves as a venter in the torsional secondary oscillation. In this manner, regions near upper and lower ends of the oscillator 40 and regions near positions apart from the upper and lower ends of the oscillator 40 by a distance corresponding to ½ of an entire length function as ventral positions P2 of the torsional secondary oscillator.

On the other hand, the oscillator 40 in the torsional tertiary oscillation mode torsionally oscillates as shown in FIG. 7. That is, in this drawing, each region denoted by reference character P3 serves as a venter in the torsional tertiary oscillation. In this manner, regions near upper and lower ends of the oscillator 40 and regions near positions apart from the upper and lower ends of the oscillator 40 by a distance corresponding to ⅓ of an entire length function as ventral positions P2 of the torsional secondary oscillator. It is to be noted that the polarization units are provided at the ventral portions near the central portion of the oscillator 40 in the longitudinal direction in the positions P3 as depicted in FIG. 3 in order to utilize the torsional tertiary oscillation.

The ultrasonic motor according to this first embodiment is designed so that a value of (T/W) can become approximately 0.3 since the torsional tertiary oscillation is utilized as the torsional oscillation. As a result, a resonant frequency in the longitudinal primary oscillation mode is substantially conformed with a resonant frequency in the torsional tertiary oscillation mode.

Figure 8:
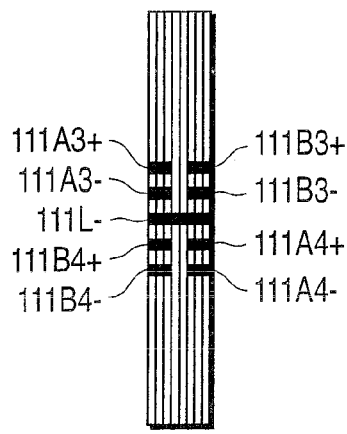
FIG. 8 is a view showing a structural example of an oscillator (one side surface) seen from an X1 direction depicted in FIG. 4.
Figure 9:
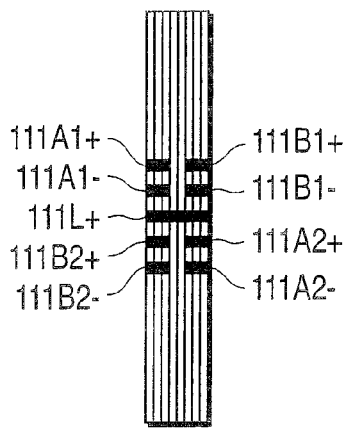
FIG. 9 is a view showing a structural example of the oscillation (the other side surface) seen from an X2 direction depicted in FIG. 4.

FIG. 8 is a view showing a structural example of the oscillator 40 (one side surface) seen from an X1 direction depicted in FIG. 4. FIG. 9 is a view showing a structural example of the oscillator 40 (the other side surface) seen from an X2 direction depicted in FIG. 2. As shown in FIG. 8 and FIG. 9, external electrodes are formed on the respective side surfaces of the oscillator 40 as follows.

That is, as shown in FIG. 8, the one side surface of the oscillator 40 is configured as follows.

The exposed portions 41$ce$ associated with a polarization unit (an A3+ phase) 101A3+ are short-circuited by an external electrode 111A3+.

The exposed portions 42$ce$ associated with a polarization unit (an A3− phase) 101A3− are short-circuited by an external electrode 111A3−.

The exposed portions 41$de$ associated with a polarization unit (a B4+ phase) 101B4+ are short-circuited by an external electrode 111B4+.

The exposed portions 42$de$ associated with a polarization unit (a B4− phase) 101B4− are short-circuited by an external electrode 111B4−.

The exposed portions 42$ee$ associated with a polarization unit (an L− phase) 101L− are short-circuited by an external electrode 111L−.

The exposed portions 41$ce$ associated with a polarization unit (a B3+ phase) 101B3+ are short-circuited by an external electrode 111B3+.

The exposed portions 42$ce$ associated with a polarization unit (a B3− phase) 101B3− are short-circuited by an external electrode 111B3−.

The exposed portions 41$de$ associated with a polarization unit (an A4+ phase) 101A4+ are short-circuited by an external electrode 111A4+.

The exposed portions 42$de$ associated with a polarization unit (an A4− phase) 101A4− are short-circuited by an external electrode 111A4−.

Further, as shown in FIG. 9, the other side surface of the oscillator 40 is configured as follows.

The exposed portions 41$ae$ associated with a polarization unit (an A1+ phase) are short-circuited by an external electrode 111A1+.

The exposed portions 42$ae$ associated with a polarization unit (an A1− phase) are short-circuited by an external electrode 111A1−.

The exposed portions 41$be$ associated with a polarization unit (a B2+ phase) are short-circuited by an external electrode 111B2+.

The exposed portions 42$be$ associated with a polarization unit (a B2− phase) are short-circuited by an external electrode 111B2−.

The exposed portions 41$ee$ associated with a polarization unit (an L+ phase) 101L+ are short-circuited by an external electrode 111L+.

The exposed portions 41$ae$ associated with a polarization unit (a B1+ phase) 101B1+ are short-circuited by an external electrode 111B1+.

The exposed portions 42$ae$ associated with a polarization unit (a B1− phase) 101B1+ are short-circuited by an external electrode 111B1−.

The exposed portions 41$be$ associated with a polarization unit (an A2+ phase) 101A2+ are short-circuited by an external electrode 111A2+.

The exposed portions 42$be$ associated with a polarization unit (an A2− phase) 101A2− are short-circuited by an external electrode 111A2−.

Figure 10:
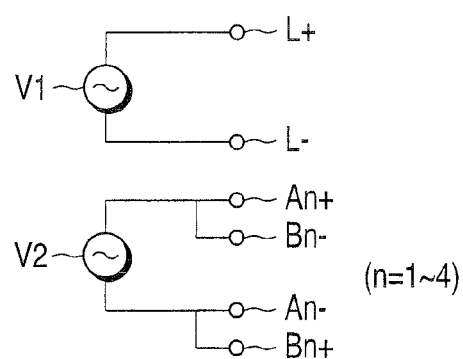
FIG. 10 is a view showing a circuit structural example configured to input a drive signal to each polarization unit.

A driving method for the ultrasonic motor according to this first embodiment will now be described. FIG. 10 is a view showing a circuit structural example for inputting a drive signal to each polarization unit. That is, the following alternating voltage is applied to each polarization unit.

An alternating voltage V1 is applied to the polarization (an L phase) 101L.

An alternating voltage V2 that has a predetermined phase difference (e.g., 90°) with respect to the alternating voltage V1 and a predetermined amplitude is applied to the polarization unit (an A1 phase) 101A1, the polarization unit (an A2 phase) 101A2, the polarization unit (an A3 phase) 101A3, and the polarization unit (an A4 phase) 101A4.

An alternating voltage obtained by inverting the phase of the alternating voltage V2 is applied to the polarization unit (a B1 phase) 101B1, the polarization unit (a B2 phase) 101B2, the polarization unit (a B3 phase) 101B3, and the polarization unit (a B4 phase) 101B4.

In other words, the alternating voltage applied to the polarization unit (the A1 phase) and the alternating voltage applied to the polarization unit (the B1 phase) 101B1 have a phase difference of 180°. The alternating voltage applied to the polarization unit (the A2 phase) 101A2 and the alternating voltage applied to the polarization unit (the B2 phase) 101B2 have a phase difference of 180°. The alternating voltage applied to the polarization unit (the A3 phase) 101A3 and the alternating voltage applied to the polarization unit (the B3 phase) 101B3 have a phase difference of 180°. The alternating voltage applied to the polarization unit (the A4 phase) 101A4 and the alternating voltage applied to the polarization unit (the B4 phase) have a phase difference of 180°.

A frequency of each of the alternating voltage V1 and the alternating voltage V2 is a frequency obtained by substantially conforming a resonant frequency of the longitudinal primary oscillation to a resonant frequency of the torsional tertiary oscillation.

When the above-described drive signal is input to each polarization unit, the longitudinal primary oscillation and the torsional tertiary oscillation can be simultaneously excited in the oscillator 40. Specifically, the polarization unit (the L phase) excites the longitudinal primary oscillation. The polarization unit (the A1 phase) 101A1 to the polarization unit (the A4 phase) 101A4 and the polarization unit (the B1 phase) 101B1 to the polarization unit (the B4 phase) 101B4 excite the torsional tertiary oscillation.

In the oscillator 40 in which the longitudinal primary oscillation and the torsional tertiary oscillation are simultaneously excited in this manner, elliptic oscillation occurs at an upper end surface thereof. Here, the frictional member 14 provided on the upper end surface of the oscillator 40 is pressed against the rotor 13 by the pressing force of the pressing mechanism unit 20, and the rotor 13 is driven to rotate by the elliptic oscillation at the upper end surface.

As described above, according to this first embodiment, the ultrasonic motor having the simple configuration and the high assembling easiness can be provided. Specifically, the ultrasonic motor according to this first embodiment exercises the following effects, for example.

Since the oscillator can be constituted of the single member, the configuration of the oscillator can be simplified.

Adjusting the drive signal applied to the polarization unit (the L phase) 101L and the drive signals applied to the polarization unit (the A1 phase) 101A1 to the polarization unit (the A4 phase) 101A4 and the polarization unit (the B1 phase) 101B1 to the polarization unit (the B4 phase) 101B4 enables controlling an elliptic shape of the elliptic oscillation that occurs at the upper end surface of the oscillator 40.

That is, since the longitudinal oscillation and the torsional oscillation can be independently excited in the oscillator 40, a freedom degree of control over the ultrasonic motor can be improved.

It is to be noted that all of the polarization unit (the A1 phase) 101A1 to the polarization unit (the A4 phase) 101A4 and the polarization unit (the B1 phase) 101B1 to the polarization unit (the B4 phase) 101B4 do not have to be provided as the polarization units configured to excite the torsional oscillation, and providing at least one polarization unit configured to excite the torsional oscillation can suffice. A modification described below is a modification utilizing this configuration.

MODIFICATION

A difference from the ultrasonic motor according to the first embodiment will now be described. In the ultrasonic motor according to this modification, the polarization unit (the A3 phase) 101A3 and the polarization unit (the B3 phase) 101B3 are used for detecting oscillation.

That is, in the ultrasonic motor according to this modification, four polarization units are utilized to excite the torsional tertiary oscillation in the oscillator 40, one polarization unit is utilized to excite the longitudinal primary oscillation in the oscillator 40, and two polarization units are utilized to detect oscillation in the oscillator 40.

Specifically, driving/oscillation detection is performed as follows.

An alternating voltage V1 is applied to the polarization unit (the L phase) 101L formed near the node portion of the longitudinal primary oscillation.

An alternating voltage V2 having a predetermined phase difference (e.g., 90°) with respect to the alternating voltage V1 is applied to the polarization unit (the A1 phase) 101A1 and the polarization unit (the A2 phase) 101A2 in the polarization units formed near the ventral portions of the torsional tertiary oscillation.

An alternating voltage obtained by inverting the phase of the alternating voltage V2 is applied to the polarization unit (the B1 phase) 101B1 and the polarization unit (the B2 phase) 101B2.

The polarization unit (the A3 phase) 101A3 and the polarization unit (the B3 phase) 101B3 are utilized to detect oscillation as will be described later.

In more detail, when an oscillation detection signal detected by the polarization unit (the A3 phase) 101A3 is added to an oscillation detection signal detected by the polarization unit (the B3 phase) 101B3, a torsional tertiary oscillation component is canceled out. Therefore, a longitudinal primary oscillation component alone can be detected.

Further, when a difference between the oscillation detection signal detected by the polarization unit (the A3 phase) 101A3 and the oscillation detection signal detected by the polarization unit (the B3 phase) 101B3 is taken, the longitudinal primary oscillation component as an in-phase component is canceled out. Therefore, the torsional tertiary oscillation component alone can be detected.

Controlling a drive frequency to maintain a phase difference between the obtained oscillation detection signal and the alternating voltage as the drive signal at a predetermined value enables more stable driving. It is to be noted that, since a technology concerning frequency tracking based on the oscillation detection signal itself is not a characteristic part of the invention according to the present application, the detailed explanation of the technology concerning the frequency tracking will be omitted.

As described above, according to this modification, it is possible to provide the ultrasonic motor that can exercise the same effects as those of the ultrasonic motor according to the first embodiment and can perform frequency tracking based on the oscillation detection signals without complicating the configuration.

It is to be noted that the example where the ultrasonic unit (the A3 phase) 101A3 and the polarization unit (the B3 phase) 101B3 are used for the oscillation detection has been explained above, but the polarization units having other phases (e.g., the polarization unit (the A4 phase) 101A4 and the polarization unit (the B4 phase) 101B4) can be of course used for the oscillation detection.

Second Embodiment

An ultrasonic motor according to this second embodiment will now be described hereinafter. It is to be noted that differences from the ultrasonic motor according to the first embodiment will be described to avoid a tautological explanation.

One of the major differences from the configuration of the ultrasonic motor according to the first embodiment is a configuration of an external electrode that corresponds to the polarization unit (the L phase) 101L formed near the node portion of the longitudinal primary oscillation and short-circuits respective exposed portions. In this second embodiment, the polarization unit (the L phase) 101L is substantially divided and used for a plurality of applications by forming the external electrodes as follows.

Figure 11:
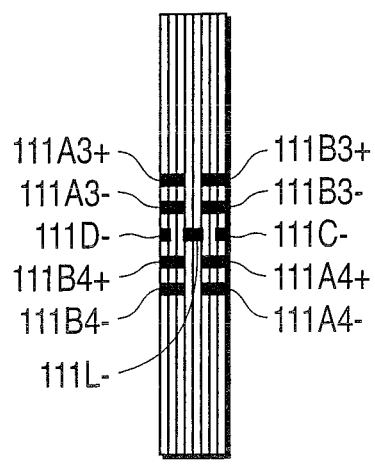
FIG. 11 is a view showing a structural example of the oscillator (one side surface) seen from the X1 direction depicted in FIG. 4.
Figure 12:
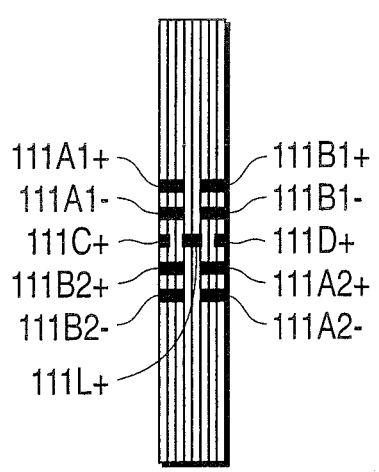
FIG. 12 is a view showing a structural example of the oscillator (the other side surface) seen from the X2 direction depicted in FIG. 4.

FIG. 11 is a view showing a structural example of an oscillator 40 (one side surface) seen from the X1 direction depicted in FIG. 4. FIG. 12 is a view showing a structural example of the oscillator 40 (the other side surface) seen from the X2 direction depicted in FIG. 4. That is, the external electrodes are formed on the side surface of the oscillator 40 as follows.

As shown in FIG. 11, on the one side surface, the exposed portion 42ee associated with the polarization unit formed near the node portion of the longitudinal primary oscillation is divided into three pieces in a laminating direction to provide an external electrode 111L−, an external electrode 111C−, and an external electrode 101D−.

As shown in FIG. 12, on the other side surface, the exposed portion 41ee associated with the polarization unit (the L phase) formed near the node portion of the longitudinal primary oscillation is divided into three pieces in the laminating direction to provide an external electrode 111L+, an external electrode 111C+, and an external electrode 101D+.

Here, an internal electrode short-circuited by the external electrode 111C+ and an internal electrode short-circuited by the external electrode 111C− constitute a polarization unit (a C phase) for oscillation detection. An internal electrode short-circuited by the external electrode 111D+ and an internal electrode short-circuited by the external electrode 111D− constitute a polarization unit (a D phase) for oscillation detection. An internal electrode short-circuited by the external electrode 111L+ and an internal electrode short-circuited by the external electrode 111L+ constitute a polarization unit (an L phase) configured to excite the longitudinal primary oscillation.

Additionally, the polarization unit (the C phase) and the polarization unit (the D phase) are utilized as follows.

That is, when an oscillation detection signal detected by the polarization unit (the C phase) is added to an oscillation detection signal detected by the polarization unit (the D phase), a torsional tertiary oscillation component is canceled out. Therefore, a longitudinal primary oscillation component alone can be detected.

Further, when a difference between the oscillation detection signal detected by the polarization unit (the C phase) and the oscillation detection signal detected by the polarization unit (the D phase) is taken, the longitudinal primary oscillation component as an in-phase component is canceled out. Therefore, a torsional tertiary oscillation component alone can be detected.

Controlling a drive frequency to maintain a phase difference between the thus detected oscillation detection signal and an alternating voltage as a drive signal at a predetermined value enables more stable driving.

As described above, according to this second embodiment, it is possible to provide the ultrasonic motor that can exercise the same effects as those of the ultrasonic motor according to the first embodiment and can perform frequency tracking based on the oscillation detection signals without complicating the configuration.

In other words, like the ultrasonic motor according to the first embodiment, the four polarization units can be utilized to excite the torsional tertiary oscillation in the oscillator 40, the one polarization unit can be utilized to excite the longitudinal primary oscillation in the oscillator 40, and oscillation detection in the oscillator 40 can be also carried out (the frequency tracking based on the oscillation detection signals can be performed). When comparing with the ultrasonic motor according to <Modification>, more polarization units configured to excite the torsional tertiary oscillation that produces force in a thrust direction can be provided.

However, providing at least one polarization unit configured to excite the torsional tertiary oscillation can suffice, and sufficient force in the thrust direction can be of course obtained in the ultrasonic motor according to <Modification>.

Third Embodiment

An ultrasonic motor according to this third embodiment will now be described. It is to be noted that differences from the ultrasonic motor according to the first embodiment will be described to avoid a tautological explanation.

In the ultrasonic motor according to this third embodiment, torsional secondary oscillation is utilized as torsional oscillation. That is, the ultrasonic motor is designed so that the value of (T/W) can become substantially 0.6. As a result, a resonant frequency in a longitudinal primary oscillation mode is substantially conformed to a resonant frequency in a torsional secondary oscillation mode. Further, this resonant frequency is utilized as a drive frequency.

Figure 13:
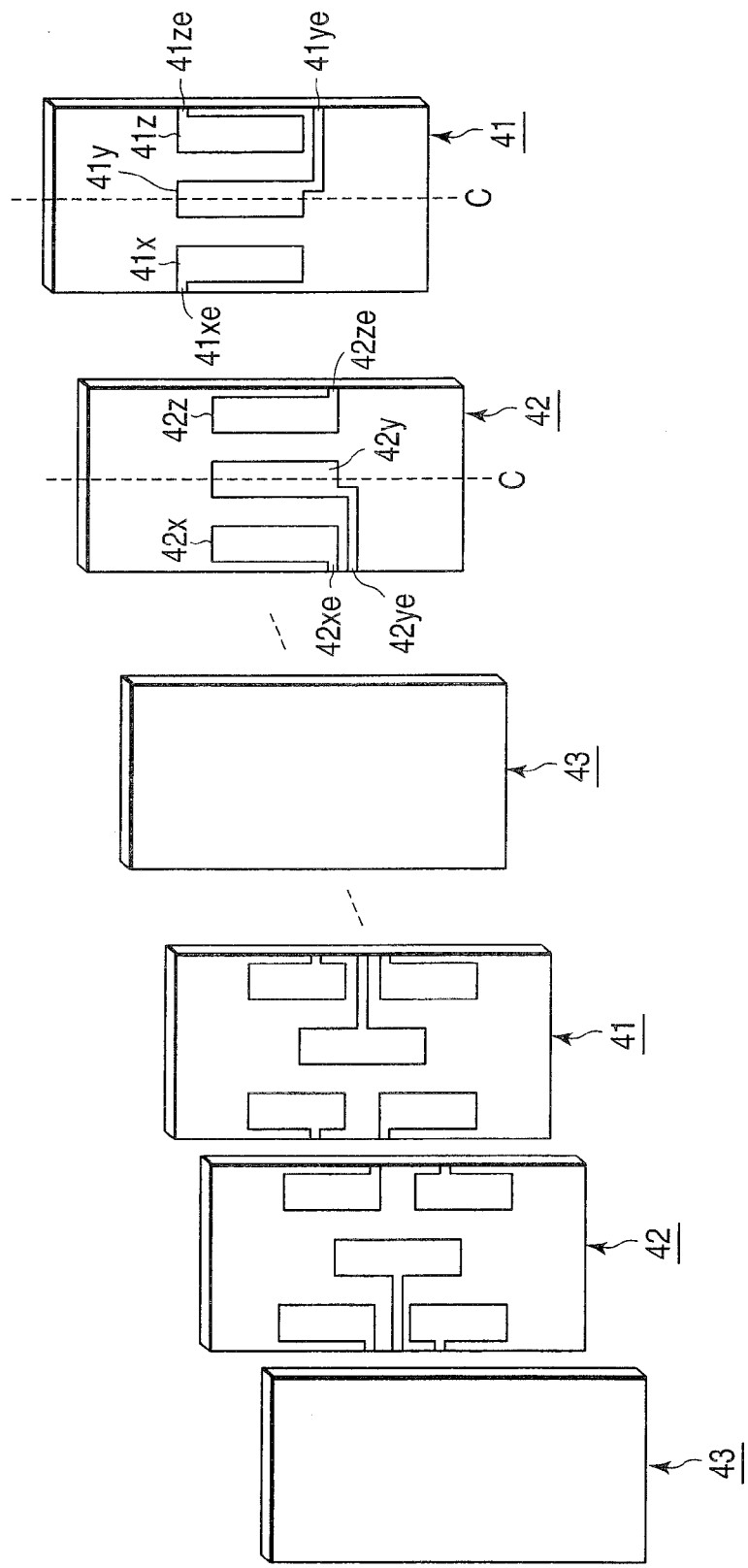
FIG. 13 is a view showing a structural example of piezoelectric sheets constituting an oscillator of an ultrasonic motor according to a third embodiment of the present invention.

FIG. 13 is a view showing a structural example of piezoelectric sheets constituting an oscillator 40 of an ultrasonic motor according to this third embodiment. The oscillator 40 is obtained by alternately laminating in a thickness direction a first piezoelectric sheet 41 and a second piezoelectric sheet 42 each having a rectangular sheet-like shape, and a third piezoelectric sheet 43 is arranged in the uppermost region and an intermediate region of the laminated body obtained by lamination.

An internal electrode 41x, an internal electrode 41y, and an internal electrode 41z are provided on an electrode forming surface of the first piezoelectric sheet 41.

In more detail, the internal electrode 41x and the internal electrode 41z are provided to be symmetrical with respect to a central line C (a line that bisects a narrow side). Furthermore, the internal electrode 41y is provided at a substantially central portion on the electrode forming surface. It is to be noted that detailed arrangement positions of the internal electrodes 41x, 41y, and 41z will be described later.

Moreover, an exposed portion 41xe extended toward an edge of one wide side of the first piezoelectric sheet 41 is provided to the internal electrode 41x. An exposed portion 41ze extended toward an edge region of the other wide side of the first piezoelectric sheet 41 is provided to the internal electrode 41z. An exposed portion 41ye extended toward the edge region of the other wide side of the first piezoelectric sheet 41 is likewise provided to the internal electrode 41y.

An internal electrode 42x, an internal electrode 42y, and an internal electrode 42z are provided on an electrode forming surface of the second piezoelectric sheet 42.

In more detail, the internal electrode 42x and the internal electrode 42z are provided to be symmetrical with respect to the central line C (the line that bisects the narrow side). Additionally, the internal electrode 42y is provided at a substantially central portion on the electrode forming surface. It is to be noted that detailed arrangement positions of the internal electrodes 42x, 42y, and 42z will be described later.

Further, an exposed portion 42xe extended toward an edge of one wide side of the second piezoelectric sheet 42 is provided to the internal electrode 42x. An exposed portion 42ze extended toward an edge of the other wide side of the second piezoelectric sheet 42 is provided to the internal electrode 42z. An exposed portion 42ye extended toward the edge of the one wide side of the second piezoelectric sheet 42 is provided to the internal electrode 42y.

No internal electrode is provided to the third piezoelectric sheet 43.

Figure 14:
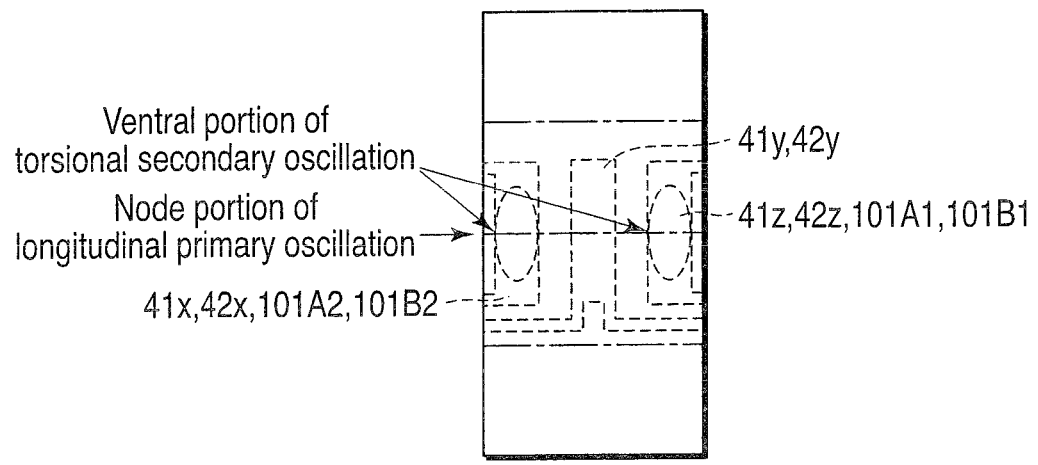
FIG. 14 is a view showing positions of node portions of longitudinal primary oscillation and ventral portions of torsional secondary oscillation in the oscillator and positions of polarization units constituted of respective internal electrodes provided in each piezoelectric sheet.

FIG. 14 is a view showing positions of a node portion of longitudinal primary oscillation and ventral portions of torsional secondary oscillation and positions of polarization units constituted of the respective internal electrodes provided on the respective piezoelectric sheets in the oscillator 40.

As shown in FIG. 14, the internal electrodes 41x, 42x, 41z, and 42z are provided at positions corresponding to the node portion of the longitudinal primary portion and the ventral portions of the torsional secondary oscillation excited in the oscillator. The internal electrodes 41y and 42y are provided at positions associated with the node portion of the longitudinal primary oscillation.

Furthermore, in the oscillator 40, regions where the internal electrode 41x and the internal electrode 42x are laminated constitute later-described polarization units 101A2 and 101B2. Regions where the internal electrode 41z and the internal electrode 42z are laminated constitute later-described polarization units 101A1 and 101B1. Moreover, positions occupied by these polarization units 101A, 101B, 101A2, and 101B2 in the oscillator 40 are positions corresponding to the node portion of the longitudinal primary oscillation and the ventral portions of the torsional secondary oscillation in oscillations excited in the oscillator 40.

Figure 15:
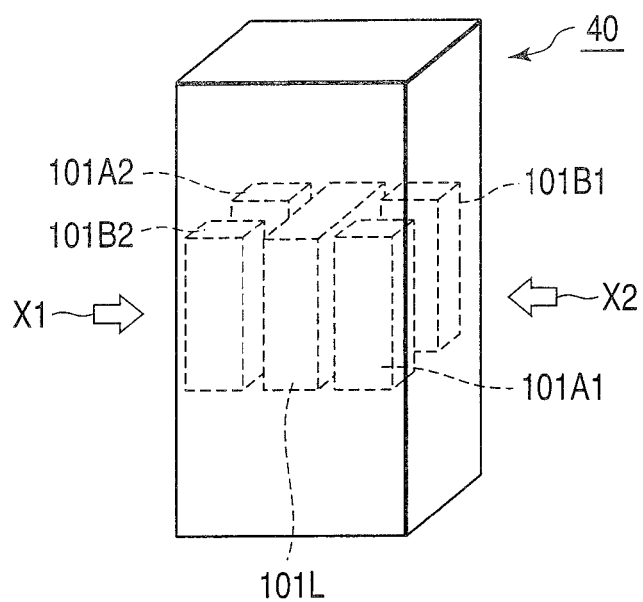
FIG. 15 is a view sowing a structural example of the oscillator.

As described above, laminating the first piezoelectric sheet 41, the second piezoelectric sheet 42, and the third piezoelectric sheet 43 enables obtaining an oscillator 40 depicted in FIG. 15. It is to be noted that, in FIG. 15, the electrodes present in the oscillator 40 are visualized and illustrated and the respective piezoelectric sheets are not individually illustrated but integrally shown as the oscillator 40 for convenience of explanation.

Moreover, in the oscillator 40, a region where the internal electrode 41y and the internal electrode 42y are laminated constitutes a polarization unit 101L (its details will be described later). A position occupied by this polarization unit 101L in the oscillator 40 is the node portion of the longitudinal primary oscillator in oscillations excited in the oscillator 40.

Figure 16:
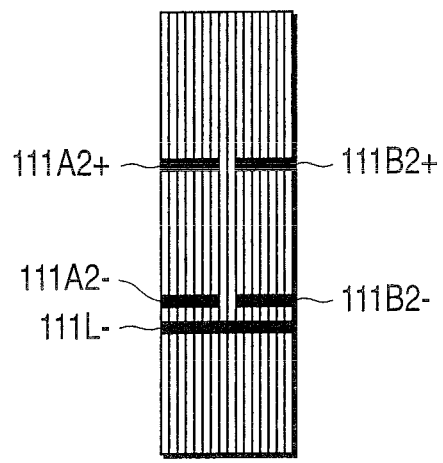
FIG. 16 is a view showing a structural example of the oscillator (one side surface) seen from an X1 direction depicted in FIG. 15.
Figure 17:
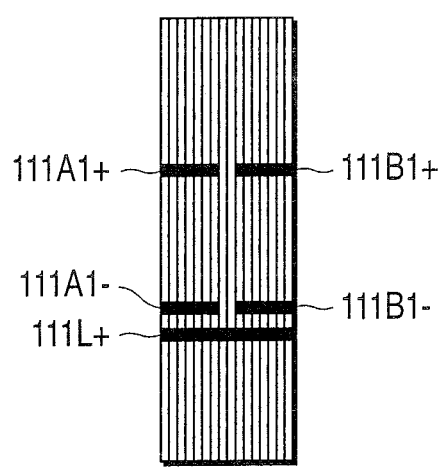
FIG. 17 is a view showing a structural example of the oscillator (the other side surface) seen from an X2 direction depicted in FIG. 15.

FIG. 16 is a view showing a structural example of the oscillator 40 (one side surface) seen from an X1 direction depicted in FIG. 15. FIG. 17 is a view showing a structural example of the oscillator 40 (the other side surface) seen from an X2 direction depicted in FIG. 15.

As shown in FIG. 16, the one side surface of the oscillator is configured as follows.

The exposed portions 41xe associated with a polarization unit (an A2+ phase) 101A2+ are short-circuited by an external electrode 111A2+.

The exposed portions 42xe associated with a polarization unit (an A2– phase) 101A2– are short-circuited by an external electrode 111A2–.

The exposed portions 42ye associated with a polarization unit (an L– phase) 101L– are short-circuited by an external electrode 111L–.

The exposed portions 41xe associated with a polarization unit (a B2+ phase) 101B2+ are short-circuited by an external electrode 111B2+.

The exposed portions 42xe associated with a polarization unit (a B2– phase) 101B2– are short-circuited by an external electrode 111B2–.

As shown in FIG. 17, the other side surface of the oscillator 40 is configured as follows.

The exposed portions 41ze associated with a polarization unit (an A1+ phase) 101A1+ are short-circuited by an external electrode 111A1+.

The exposed portions 42ze associated with a polarization unit (an A1– phase) 101A1– are short-circuited by an external electrode 111A1–.

The exposed portions 41ye associated with a polarization unit (an L+ phase) 101L+ are short-circuited by an external electrode 111L+.

The exposed portions 41ze associated with a polarization unit (a B1+ phase) 101B1+ are short-circuited by an external electrode 111B1+.

The exposed portions 42ze associated with a polarization unit (a B1– phase) 101B1– are short-circuited by an external electrode 111B1–.

A driving method for the ultrasonic motor according to this third embodiment will now be described hereinafter.

An alternating voltage V1 is applied to the polarization unit (an L phase) 101L.

An alternating voltage V2 that has a predetermined phase difference (e.g., 90°) with respect to the alternating voltage V1 and a predetermined amplitude is applied to the polarization unit (an A1 phase) 101A1 and the polarization unit (an A2 phase) 101A2. An alternating voltage obtained by inverting the phase of the alternating voltage V2 is applied to the polarization unit (a B1 phase) 101B1 and the polarization unit (a B2 phase).

In other words, the alternating voltage applied to the polarization unit (the A1 phase) 101A1 and the alternating voltage applied to the polarization unit (the B1 phase) 101B1 have a phase difference of 180°. The alternating voltage applied to the polarization unit (the A2 phase) 101A2 and the alternating voltage applied to the polarization unit (the B2 phase) 101B2 have a phase difference of 180°.

A frequency of each of the alternating voltage V1 and the alternating voltage V2 is a frequency substantially conforming with a resonant frequency of the longitudinal primary oscillation and the torsion secondary oscillation.

Inputting drive signals to the respective polarization units as described above enables simultaneously exciting the longitudinal primary oscillation and the torsional secondary oscillation in the oscillator 40. Specifically, the polarization unit (the L phase) 101L excites the longitudinal primary oscillation. At the same time, the polarization unit (the A1 phase) 101A1, the polarization unit (the A2 phase) 101A2, the polarization unit (the B1 phase) 101B1, and the polarization unit (the B2 phase) 101B2 excite the torsional secondary oscillation.

In the oscillator 40 in which the longitudinal primary oscillation and the torsional secondary oscillation are simultaneously excited, elliptic oscillation occurs at an upper end surface thereof. Here, a frictional member 14 provided at the upper end surface of the oscillator 40 is pressed against a rotor 13 by the pressing force of a pressing mechanism unit 20, and the rotor 13 is driven to rotate by the elliptic oscillation at the upper end surface of the oscillator 40.

As described above, according to this third embodiment, it is possible to provide the ultrasonic motor that exercises the same effects as those of the ultrasonic motor according to the first embodiment.

It is to be noted that the polarization units configured to excite the torsional oscillation are provided for four phases in the above example, but providing the polarization units configured to excite the torsional oscillation for at least two phases can suffice. Therefore, any polarization units for two phases may be used for oscillation detection.

Fourth Embodiment

An ultrasonic motor according to this fourth embodiment will now be described. It is to be noted that differences from the ultrasonic motor according to the third embodiment will be described to avoid a tautological explanation.

One of the main differences from the configuration of the ultrasonic motor according to the third embodiment is a configuration of an external electrode that short-circuits the respective exposed portions associated with the polarization unit (the L phase) 101L. In this fourth embodiment, the polarization unit (the L phase) 101L is substantially divided and used for a plurality of applications by forming the external electrodes as follows.

Figure 18:
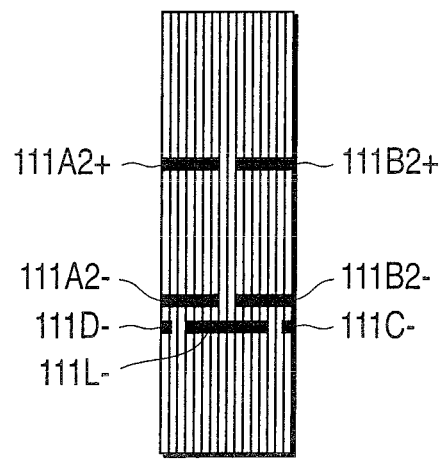
FIG. 18 is a view showing a structural example of the oscillator (one side surface) seen from the X1 direction depicted in FIG. 15.
Figure 19:
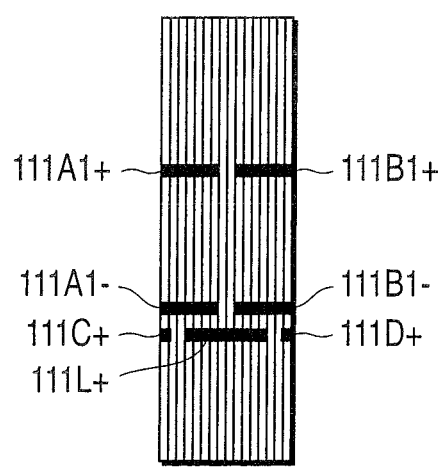
FIG. 19 is a view showing a structural example of the oscillator (the other side surface) seen from the X2 direction depicted in FIG. 15.

FIG. 18 is a view showing a structural example of an oscillator 40 (one side surface) seen from the X1 direction depicted in FIG. 15. FIG. 19 is a view showing a structural example of the oscillator 40 seen from the X2 direction depicted in FIG. 15. That is, the external electrodes are formed on the side surfaces of the oscillator 40 as follows.

As shown in FIG. 18, on the one side surface, the exposed portion 42$ye$ associated with the polarization unit formed near the node portion of the longitudinal primary oscillation is divided into three pieces in a laminating direction to provide an external electrode 111L−, an external electrode 111C−, and an external electrode 111D−.

As shown in FIG. 19, on the other side surface, the exposed portion 41$ye$ associated with the polarization unit formed near the node portion of the longitudinal primary oscillation is divided into three pieces in the laminating direction to provide an external electrode 111L+, an external electrode 111C+, and an external electrode 111D+.

Here, an internal electrode short-circuited by the external electrode 111C+ and an internal electrode short-circuited by the external electrode 111C− constitute a polarization unit (a C phase) for oscillation detection. An internal electrode short-circuited by the external electrode 111D+ and an internal electrode short-circuited by the external electrode 111D− constitute a polarization unit (a D phase) for oscillation detection. An internal electrode short-circuited by the external electrode 111L+ and an internal electrode short-circuited by the external electrode 111L− constitute a polarization unit (an L phase) configured to excite the longitudinal primary oscillation.

Further, when an oscillation detection signal detected by the polarization unit (the C phase) is added to an oscillation detection signal detected by the polarization unit (the D phase), a torsional secondary oscillation component is canceled out. Therefore, a longitudinal primary oscillation component alone can be detected.

Furthermore, when a difference between the oscillation detection signal detected by the polarization unit (the C phase) and the oscillation detection signal detected by the polarization unit (the D phase) is taken, the longitudinal primary oscillation component as an in-phase component is canceled out. Therefore, the torsional secondary oscillation component alone can be detected.

Controlling a drive frequency to maintain a phase difference between the thus detected oscillation detection signal and an alternating voltage which is a drive signal at a predetermined value enables performing more stable driving.

As described above, according to this fourth embodiment, it is possible to provide the ultrasonic motor that can exercise the same effects as those of the ultrasonic motor according to the third embodiment and can perform frequency tracking based on the oscillation detection signals without complicating the configuration. Moreover, the oscillation detection can be carried out without decreasing the number of the polarization units configured to excite the torsional secondary oscillation that produces force in a thrust direction.

In other words, like the ultrasonic motor according to the third embodiment, the four polarization units can be utilized to excite the torsional secondary oscillation in the oscillator 40, the one polarization unit can be utilized to excite the longitudinal primary oscillation in the oscillator 40, and the oscillation detection in the oscillator 40 can be also performed (the frequency tracking based on the oscillation detection signals can be carried out).

Although the present invention has been described based on the first embodiment to the fourth embodiment, the present invention is not restricted to the foregoing embodiments, and the present invention can be of course modified and applied in many ways within the gist thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic motor comprising:
   an oscillator whose cross section vertical to a central axis has a rectangular shape and which generates elliptic oscillation when longitudinal oscillation that expands or contracts in the central axis direction and torsional oscillation using the central axis as a torsional axis are simultaneously excited, a length ratio of a narrow side and a wide side constituting the rectangular shape being set to a value that conforms a resonant frequency of the longitudinal oscillation exited in the oscillator to a resonant frequency of the torsional oscillation;
   a driven body that comes into contact with an elliptic oscillation generation surface of the oscillator in which the elliptic oscillation is generated and is driven to rotate by the elliptic oscillation around the central axis; and a pressing mechanism unit that presses the oscillator against the driven body and welds the elliptic oscillation generation surface of the oscillator to the driven body by pressing, wherein the oscillator has:

a first polarization unit that is formed in a region associated with a node portion of the longitudinal oscillation and configured to excite the longitudinal oscillation in the oscillator; and a second polarization unit that is formed in a region associated with a ventral portion of the torsional oscillation and configured to excite the torsional oscillation in the oscillator.

2. The ultrasonic motor according to claim 1, wherein the two second polarization units are provided to be symmetrical with respect to a central surface that bisects the narrow side in the oscillator, a first alternating voltage is applied to the first polarization unit, a second alternating voltage having a predetermined phase difference with respect to the first alternating voltage is applied to one of the second polarization units, and an alternating voltage obtained by inverting the phase of the second alternating voltage is applied to the other of the second polarization units.

3. The ultrasonic motor according to claim 1, wherein a plurality of regions each of which is associated with the ventral portion of the torsional oscillation excited in the oscillator are present, and the second polarization units are provided in the plurality of regions associated with the ventral portions of the torsional oscillation, respectively.

4. The ultrasonic motor according to claim 3, wherein at least one of the plurality of second polarization units is used for detecting oscillation in the oscillator.

5. The ultrasonic motor according to claim 1, wherein the oscillator is constituted by laminating piezoelectric sheets which are rectangular piezoelectric elements, and the first polarization unit is divided into three pieces in the laminating direction, a polarizing region at a central portion in the three divided first polarization units is used for driving the ultrasonic motor, and the other polarizing regions are used for detecting oscillation in the oscillator.

* * * * *